United States Patent
Kolnaar et al.

(10) Patent No.: US 6,539,626 B2
(45) Date of Patent: Apr. 1, 2003

(54) PROCESS OF MAKING CURVED CERAMIC MOULDED PART CONTAINING INTERNAL ELECTRICALLY CONDUCTIVE PATHS

(75) Inventors: Johannes W. H. Kolnaar, Veldhoven (NL); Johannes L. M. Op Den Kamp, Neerbeek (NL); Jolanda I. M. Colnot, Sittard (NL); Hans H. H. Hornman, Geleen (NL)

(73) Assignee: DSM N.V., Heerlen (NL)

( * ) Notice: Subject to any disclaimer, the term of this patent is extended or adjusted under 35 U.S.C. 154(b) by 0 days.

(21) Appl. No.: 09/729,671

(22) Filed: Dec. 5, 2000

(65) Prior Publication Data

US 2001/0006114 A1 Jul. 5, 2001

Related U.S. Application Data

(63) Continuation of application No. PCT/NL99/00343, filed on Jun. 3, 1999.

(30) Foreign Application Priority Data

Jun. 5, 1998 (NL) ............................................. 1009321

(51) Int. Cl.⁷ .................................................. H01K 3/22
(52) U.S. Cl. ............................. 29/851; 29/830; 29/846; 264/614; 264/633; 156/89.16; 156/245; 174/255; 361/795; 428/210; 428/901
(58) Field of Search .......................... 29/851, 846, 825, 29/831, 832, 830; 264/614, 618, 619, 633; 156/89.12, 89.16, 245; 428/901, 210; 361/792, 795; 174/255, 256, 258

(56) References Cited

U.S. PATENT DOCUMENTS

| 4,445,274 A | * | 5/1984 | Suzuki et al. .................. 29/832 |
| 5,017,434 A | | 5/1991 | Enloe et al. |
| 5,216,207 A | | 6/1993 | Prabhu et al. |
| 5,470,345 A | | 11/1995 | Hassler et al. |
| 5,662,755 A | | 9/1997 | Miura et al. |

FOREIGN PATENT DOCUMENTS

| FR | 2571545 | 4/1986 |
| JP | 3153059 | 5/1991 |
| WO | WO9715077 | 4/1997 |

* cited by examiner

*Primary Examiner*—Richard Chang
(74) *Attorney, Agent, or Firm*—Pillsbury Winthrop LLP

(57) ABSTRACT

A curved multilayer ceramic moulded part, particularly curved in directions perpendicular to one another, is limited by two virtually parallel surfaces and an edge. Electrically conductive path(s) parallel to the surface are provided internally. The molded part may be produced by deforming a dish-shaped green moulding, formed from a composite of a self-supporting ceramic film having at least one electrically conductive path and at least one additional ceramic film, with or without electrically conductive path(s), to pressure from all sides. The deformed part is subjected to burning out and sintering. The moulded articles are virtually free of defects. Absolute deviation from the average shrinking of less than 2% may be obtained.

14 Claims, 2 Drawing Sheets

PROCESS OF MAKING CURVED CERAMIC MOULDED PART CONTAINING INTERNAL ELECTRICALLY CONDUCTIVE PATHS

This is a Continuation of International Appln. No. PCT/NL99/00343 filed Jun. 3, 1999 which designated the U.S.

The invention relates to a multilayer ceramic moulded part, limited by two virtually parallel surfaces and an edge, which internally contains one or more electrically conductive paths parallel to the two surfaces.

Such an object is known from U.S. Pat. No. 5,470,345 (HASSLER, B.A. et al.) Nov. 28, 1995. U.S. Pat. No. 5,470,345 describes a multilayer ceramic box consisting of several layers sintered onto one another, which layers contain electrically conductive paths on their surfaces. After these layers have been sintered, the ceramic wall of the box internally contains electrically conductive paths, virtually parallel to the surface. Electronic components and a battery are placed in the interior of the box, the wall of the box serving as a printed circuit board. The box, glued to with a lid, is then used for example as a pacemaker in the body.

A drawback of such a box is that it is made from ceramic layers formed from films cast from a suspension of a mixture of oxides and organic matter as described in HASSLE, BETH A. "Fast Turnaround Multilayer Coiled Ceramic Motherboard Fabrication". In: Proceedings of ASM's 2nd Electronic Packaging: Materials and Processes Conference (October 1985): 117–121. This suspension was cast onto a carrier material, spread out to the required thickness with a doctor blade. The cast film was then carefully dried by passing air over it. The dried film was stored on a roll. The surface of the film thus prepared was provided with one or more electrically conductive paths. Several films were stacked on top of one another to obtain a multilayer object. Elimination of the organic binder through burning, and sintering then led to the formation of a multilayer ceramic moulded part that internally contained electrically conductive paths. A drawback of such a flexible film is however that it has an elongation at break which, in a composition of several layers, is insufficient for forming a curved surface without the film tearing in the outer layers or delamination occurring between the layers. A characteristic of the known multilayer moulded part is hence that it contains defects in the curvature. As a disadvantageous consequence of this, the electrically conductive paths created in the curved part of the moulded part are often interrupted.

The invention aims to provide a multilayer ceramic moulded part that does not present this drawback.

The multilayer ceramic moulded part according to the invention is characterised in that it is curved in at least one direction and is free of defects. Preferably the moulded part according to the invention is curved at an angle of 40° to 180°, more preferably at an angle of 90° to 180°. The moulded part according to the invention may have a radius of curvature at the curvature that is smaller than 100 mm and preferably smaller than 30 mm. Most preferably the radius of curvature of the moulded part according to the invention is smaller than 10 mm. In general, the radius of curvature of the moulded part according to the invention is greater than 1 mm and preferably greater than 3 mm. 'Defects' are here and hereinafter understood to be delaminations between the layers and tears in the outer layers.

Preferably the moulded part is curved in two directions perpendicular to one another. This ensures that a closed moulded part consisting of only two parts, for example a box, can be composed.

If there are several conductive paths in a section through the thickness of the film, the distance between the conductive paths in a direction perpendicular to the surface of the moulded part is generally not critical and is determined by the minimum thickness of the film(s) of which the moulded part has been composed. As the minimum thickness of the film is approximately 1 $\mu$m, the distance between the conductive paths in a direction perpendicular to the surface is greater than 1 $\mu$m. It is difficult to indicate an upper limit to the distance between the conductive paths, as this will depend not only on the thickness of a single film, but also on the number of films stacked without a conductive path before another conductive path is applied. In general the aforementioned distance between the conductive paths will not exceed 100 $\mu$m.

In addition to conductive paths parallel to the surface, the moulded part also contains conductive paths in a direction perpendicular to the surface. They will here and hereinafter be referred to as vias. They can be used to connect internal conductive paths with one another and with electronic components present on the surface of the moulded part, or to create electric passages through the wall of the ceramic moulded part.

Preferably conductive paths are at least in a curved part of the moulded part. This will ensure that optimum use is made of the surface of the curved moulded part to create passages and conductive paths parallel to the surface.

The invention also relates to process for the production of multilayer ceramic moulded part according to the invention.

BRIEF DESCRIPTION OF THE DRAWING FIGURES

Figure 1:
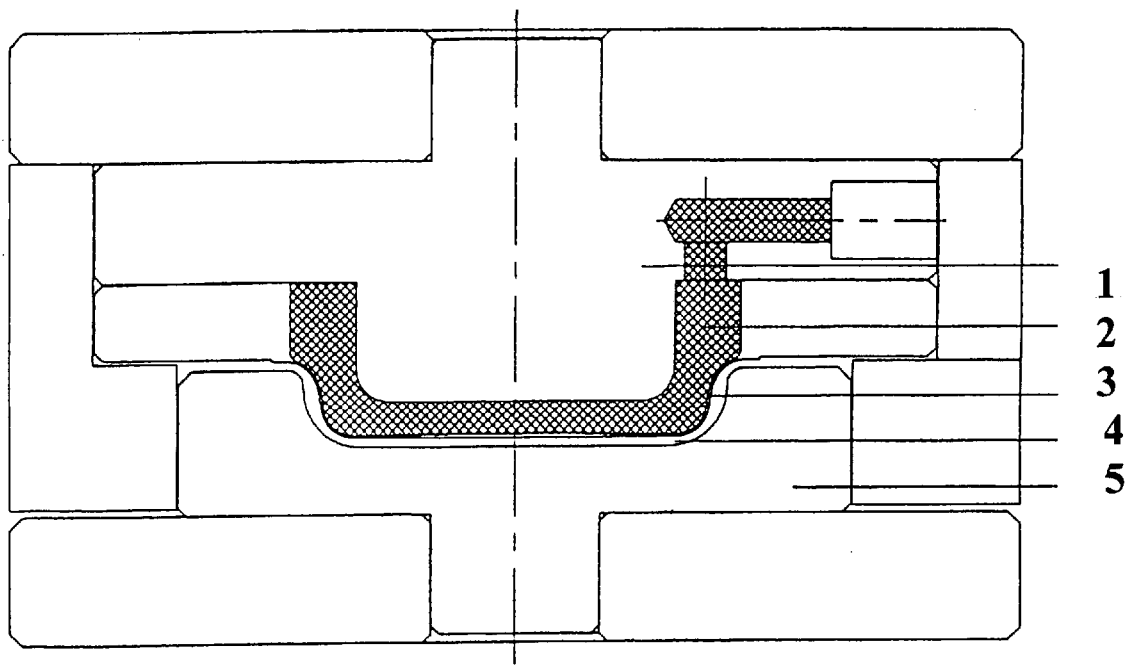
FIG. 1 is a schematic view, in elevation, of a forming mold which may be used in accordance with an embodiment of the invention.

The process according to the invention comprises the following steps:

a) positioning means are created in a self-supporting film containing an inorganic solid substance and a binder, which has a porosity of between 20 and 90 vol. %, an inorganic solids content of between 40 and 80 vol. %, relative to the total volume of inorganic solid substance and a binder, containing a polyolefine having an intrinsic viscosity of at least 5 dl/g, determined at 135° C. in decalin;

b) electrically conductive paths are created on the surface of the film provided with positioning means;

c) a composition is formed from a first film provided with electric paths as referred to under b) and at least one second film, prepared as under a) or b), at least the surface with the electrically conductive paths of the first film lying against a second film;

d) the composition formed under c) is laminated at elevated temperature and pressure e) the laminate formed under d) is deformed into a green moulding under pressure from all sides;

f) the green moulding is burned out and sintered.

An advantage of the process according to the invention is that the green moulding formed in step e) is sufficiently stable to be mechanically processed further before being sintered.

Another advantage of the process according to the invention is that the shrinkage that occurs during the sintering is almost the same in all directions, as a result of which the moulded part retains its form.

A 'self-supporting film containing an inorganic solid substance and a binder' is here and hereinafter understood to be a film that can be processed without any need for the support of a supporting film or plate.

The self-supporting film has a porosity of between 20 and 90 vol. %. The 'porosity' (P) is here and hereinafter understood to be:

$$P = [1 - \rho_f/\rho_o] \times 100\%$$

where $\rho_f$ is the density of the film and $\rho_o$ the theoretical density of the constituent components of the film.

At a porosity of less than 20 vol. % the film can be insufficiently condensed to form a laminate in which the porosity is still at least 10 vol. % and there is sufficient adhesion between the layers.

At a porosity of more than 90% the conductive paths on different films will easily short-circuit.

The self-supporting film has an inorganic solids content of between 40 and 80 vol. %, relative to the total volume of inorganic solid substance and binder. An inorganic solids content of less than 40 vol. % proved to result in a porous, weak ceramic moulded part, whereas film with a solids content of more than 80 vol. % cannot be produced via extrusion.

The self-supporting film contains a binder containing a polyolefine having an intrinsic viscosity of at least 5 dl/g, determined at 135° C. in decalin. It has been found that films whose intrinsic viscosity is lower than 5 dl/g show an unequal distribution of the inorganic solid substance across the thickness of the film, resulting in unequal shrinkage and delamination during the sintering.

Such a film can be prepared by dissolving a binder in a suitable solvent, the concentration of the binder preferably being lower than 60 wt. %, relative to the binder plus solvent and the binder consisting substantially of a polyolefine having an intrinsic viscosity of at least 5 dl/g. The solution thus prepared can subsequently be mixed with a suspension of an inorganic solid substance in the solvent and the mixture thus obtained can be converted into a solvent-containing intermediate that forms a thermally reversible gelling system whose gelling temperature and dissolution temperature lie above room temperature. The conversion can be effected in various ways, for example by means of spinning via a spinneret having a very broad slot-shaped nozzle, by means of extrusion or by casting it onto a roll or band.

Preferably the film has a surface roughness, expressed in the $R_a$ value, of less than 1 µm, preferably less than 0.5 µm. This will enable good screen printing for the creation of the conductive paths and an accurate positioning. It will also ensure that vias created in the film are accurately positioned above one another.

An advantage of the aforementioned film with a polyolefine whose intrinsic viscosity is at least 5 dl/g is that such a film generally has a greater elongation at break. Preferably the film has an elongation at break of more than 75%, more preferably more than 300% and most preferably more than 1000%.

Positioning means are created in the self-supporting film. The positioning means may for example be centring holes. The aim of these positioning means is to create a composition of several films so that the positions of the films relative to one another will not change in a laminating step to be carried out later.

One or more electrically conductive paths are created on the surface of the film provided with positioning means. Methods for creating electrically conductive paths are known and for example described in "Fast turnaround Multilayer coiled ceramic motherboard fabrication", Proceedings of ASM's 2nd Electronic Packaging: Materials and Processes Conference (October 1985, 117–121), by Beth A. Hassler. The positioning of the film is of particular importance if vias are also created in the laminate. Preferably the electrically conductive paths are created by means of screen printing. The vias are created in a known way, by filling holes punched in the film with a conductive paste.

The film derives its self-supporting character from a high modulus combined with the high elongation at break. Preferably the film has a modulus of more than 500 MPa and more preferably more than 1 GPa. This will make it easy to punch holes for the vias in the film without the risk of the film being deformed along the edges of the vias.

A composition is formed from a first film provided with electric paths and at least one second film, the surface of which second film may or may not be provided with electrically conductive paths and at least the surface of the first film provided with electrically conductive paths lying against a second film. This will ensure that the moulded part internally contains one or more electrically conductive paths.

The composition thus formed is laminated at elevated temperature and pressure. The temperature and pressure are preferably chosen so that sufficient adhesion results between the layers, so that the layers do not shift relative to one another during the moulding step, resulting in, for example the interruption of vias created in the film, and sufficient porosity moreover remains to deform the laminate so that no internal stresses form in the green moulded part. Internal stresses in the green moulded part could lead to differences in shrinkage during the sintering. The porosity of the laminate thus formed lies between 10 and 60 vol. %. At a porosity of less than 10% the moulded part proved to show a greater spread in the shrinkage in various directions after the sintering, causing the object to lose its form during the sintering. A porosity of more than 60% proves to result in a poor adhesion between the constituent films, as a result of which in particular the conductive path in the vias is interrupted.

A person skilled in the art will easily be able to experimentally determine the temperature and pressure at which the lamination is to be effected to obtain a porosity of between 10 and 60%. Preferably the composition obtained is laminated at a temperature of between 100 and 160° C. and a pressure of between 0.5 and 10 MPa.

If the laminate has been laminated at elevated temperature, it is recommendable to allow it to cool in the press until the temperature reaches a value at which the stability under load is sufficient to punch a desired circumference from the laminate and subsequently transfer it to a forming press.

The laminate is subsequently formed into a green moulding under pressure from all sides. Compression under pressure from all sides is understood to imply that the object is compressed in a closed mould containing a punch, fitted with an impermeable flexible membrane that separates the laminate to be compressed from a liquid used to pressurise the membrane. Such a membrane may for example be made of metal or rubber. An advantage of using pressure from all sides is that all walls are equally compressed, as a result of which the porosity in the green moulding formed is more or less the same in all places. When the green moulding is sintered, the pressure from all sides is preferably between 5 and 25 MPa. At a pressure of more than 25 MPa there will be insufficient porosity in the burning-out preceding the sintering to allow the gases formed to escape, resulting in the formation of blisters. At a pressure of less than 5 MPa porosities are observed after the sintering. This moreover ensures that the shrinkage during the subsequent sintering process is the same in all places and the object retains its form. Methods for compressing an object under pressure from all sides are known from the literature. Pressure from all sides can for example be exerted on an object by compressing the object with the aid of a mould, the punch containing a rubber or thin metal membrane that is pressed against the moulded part to be compressed via liquid pressure.

The temperature at which the laminate is deformed is not critical. Preferably the laminate is deformed into a green moulding at a temperature of between 100 and 160° C. under pressure from all sides. This will ensure that the moulded part shrinks homogeneously during the sintering.

The green moulding can be subjected to mechanical further processing if so desired. This can for example be achieved by turning and or drilling after the product has been cooled in liquid nitrogen.

The green moulding is finally burned out and sintered according to known methods.

The invention also relates to a laminate containing at least two ceramic films, at least one of the films being provided with electrically conductive paths, which films contain a binder and an inorganic solid substance, the concentration of the inorganic solid substance being between 40 and 80 vol. %, relative to the total volume of the solid substance and the binder, characterised in that the binder contains at least a polyolefine having an intrinsic viscosity of at least 5 dl/g, determined at 135° C. in decalin, and the laminate has a porosity of between 10 and 60 vol. %.

The invention also relates to a green moulding which has shrunk in all directions after the sintering, characterised in that the absolute deviation from the average shrinkage is less than 2%.

The invention will be further elucidated with reference to examples without restricting itself hereto.

EXAMPLE I

Preparation of a laminate 9 parts by volume of polyethylene (Mw approx. $2\times10^6$ gr/mol IV=18) were added to 60 parts by volume of decalin. 35 parts by volume of $Al_2O_3$ were added to 60 parts by volume of decalin and the suspension obtained was then ground in a ball mill for 10 hours. After venting and grinding, the suspensions described above were mixed in a 1:2.7 ratio, so that ultimately a suspension having a polymer:solvent: $Al_2O_3$ volume ratio of 20:180:30 (p:s:a) was obtained. The suspension obtained was fed to a twin-screw extruder fitted with a spinning pump, a Sulzer mixer and a flat film head and extruded at approx. 170° C. After extrusion the film obtained with a width of 200 mm was quenched in water and dried. The film's porosity was 30%, the film's thickness was 175 mm and the film contained 64 vol. % alumina.

Pieces measuring 140 by 140 mm were cut from the film (blanking). Vias (vertical passages through the substrate) and centring holes were created in the film by means of punching.

The vias created in the film were filled with a thick conductive tungsten paste (via filling). The metallisation pattern was created with the aid of the screen-printing etching technique by printing different conductive paths on 17 films (screen printing). The 17 films were then stacked, with the centring holes serving to position the films relative to one another so that the vias are in contact with the adjacent metallisation layers.

The compositions thus formed were placed in a flat (laminating) mould and then compressed for 12 minutes under pressure (1.5 MPa) in a preheated press (150° C.). The laminates were subsequently cooled in de press under pressure (1.5 MPa) until the temperature of the laminate was lower than 70° C. This process resulted in a laminate having an average porosity of 25%. (See table 4)

EXAMPLE II

Figure 2:
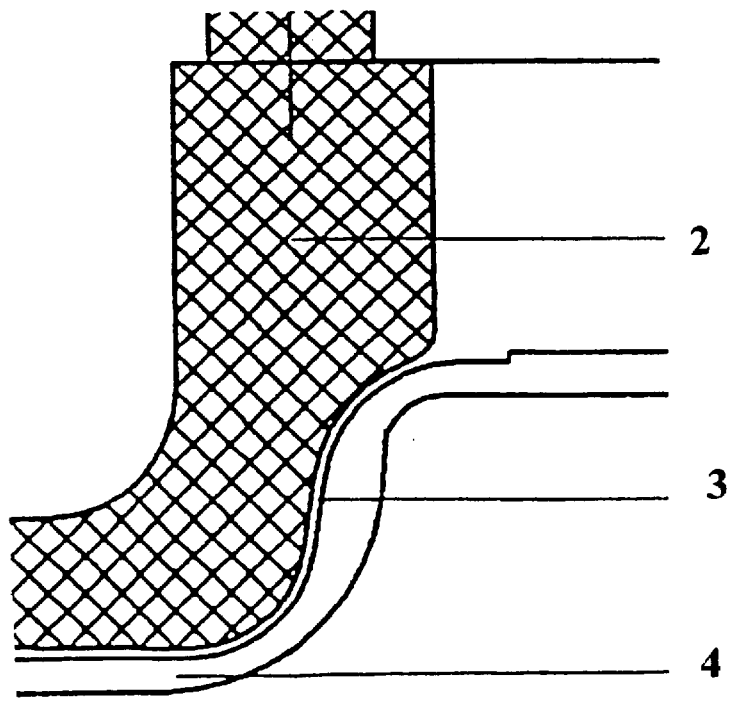
FIG. 2 is an enlarged schematic view, in elevation, of a portion of the forming mold of FIG. 1.
Figure 3:
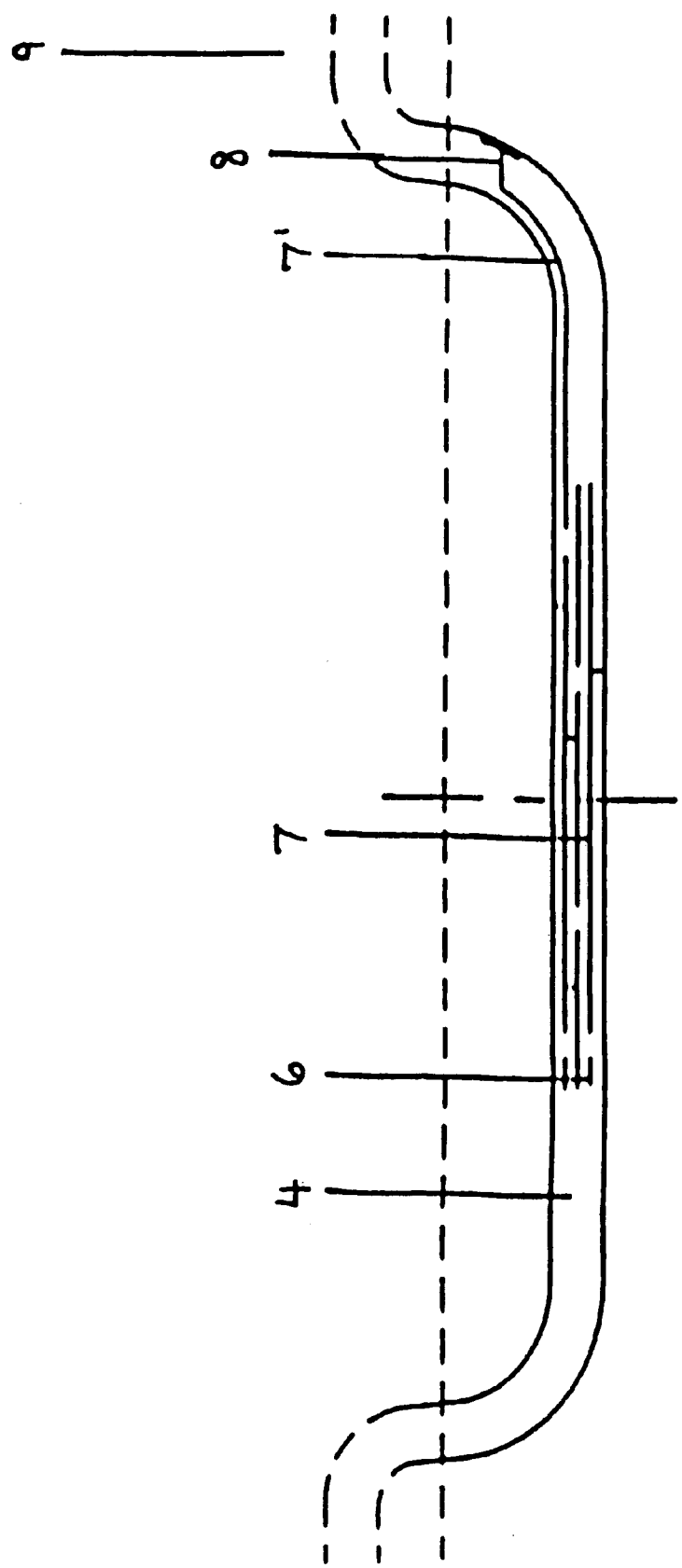
FIG. 3 is a schematic view, in elevation, of an embodiment of a curved molded part according to the invention.

Production of a multilayer 3D moulded part based on the laminate described in Example I using a Quasi Isostatic mould Disks with a diameter of 64 mm were punched from the cooled laminate of Example I, which were preheated on a heating plate of 155° C. for 3 minutes. The heated laminates were placed at the centre of an unheated forming mould and compressed to the 3D shape shown in FIG. 3 at an isostatic pressure from all sides for 6 minutes. The forming mould (FIGS. 1 and 2) consist of a punch (1) with a preformed impermeable flexible membrane behind it (3) an oil reservoir (2) and a mold (5). Next, the 3D moulded part (4) was cooled in the forming mould to a temperature of 70° C. at the same isostatic pressure from all sides.

The 3D moulded part (FIG. 3) was removed from the mould, after which the superfluous rims (9) were mechanically cut off. The 3D moulded parts were then burned out and sintered.

This resulted in a 3D ceramic dish with smoothly finished edges and a homogeneous density (=3.9 $g/cm^3$), which retains its form, which means that the shrinkage is virtually the same in all dimensions. Tables 1 and 3, whose shrinkage values were calculated using the measuring values of Nos 1 up to and including 13 in Tables 3b and 3c, show that a maximum deviation of the shrinkage in all dimensions is only 1.5% from the average can be obtained for the dish used in this example (FIG. 3) at an isostatic pressure from all sides of 9 MPa. The conductive paths (7 and 7') and the vias (6) and also the passage through the wall (8) of the ceramic part (4) were not interrupted.

COMPARATIVE EXPERIMENT A

Production of a multilayer 3D moulded part based on the laminate described in Example 1 with the aid of a rigid mould Disks with a diameter of 64 mm were punched from the cooled laminate of Example I, which were preheated for 3 minutes on a heating plate of 155° C. The heated laminates were then placed at the centre of an unheated conventional static forming mould and compressed for 6 minutes at a constant linear pressure on the projected plane to obtain the 3D form shown in FIG. 3. Next, the 3D moulded part was cooled in the forming mould at the same pressure to a temperature of 70° C.

The 3D moulded part was removed from the mould, after which the superfluous rims were mechanically cut off. The 3D moulded parts were then burned out and sintered.

This resulted in 3D ceramic dishes with jagged edges with an inhomogeneous density (wall smaller than 3.7 $g/cm^3$, base=3.9 $g/cm^3$), which do not retain their form, which means that the shrinkage varies substantially in all dimensions. Tables 1 and 3a, whose shrinkage values were calculated using the measuring values of Nos. 14 up to and including 23 of Tables 3b and 3c, show that in the most optimum case, at a pressure of 18 MPa, the dish used in this Example still has a deviation of the shrinkage in all dimensions of more than 4% from the average. The electrically conductive circuit in the ceramic moulded part is interrupted.

EXAMPLE III

Production of a 3D moulded part using a stack laminated at different pressures using a Quasi Isostatic mould The stacks described in Example I were placed in a flat (laminating) mould and were then compressed at a certain laminating pressure (see Table 4) in a preheated press (150° C.) for 12 minutes. The laminates were then cooled in the press at the same pressure until the temperature of the laminate was lower than 70° C. This process resulted in a laminates with an average porosity of between 18% and 30%. (See Table 4).

3D ceramic moulded parts were then made from the cooled laminates in the manner described in Example 2. The isostatic forming pressure from all sides was 9 MPa in all cases. Table 2 shows the values of the camber, which is a measure of the degree to which a dish retains its form during sintering. The camber is expressed in % and is calculated by dividing the difference in height between the rim and the middle of the dish, expressed in mm, by 15 mm and multiplying by 1000. Table 2 shows that in the case of the dish used in this example, a laminating pressure of 1.5 MPa results in a dish without delaminations and step formation with an average camber of only 3.8%.

COMPARATIVE EXPERIMENT B

Production of a 3D moulded part using a stack that has been laminated at different pressures using a rigid mould by means of compression at linear pressure The stacks described in Example I were placed in a flat (laminating) mould and were then compressed at a certain pressure in a preheated press (150° C.) for 12 minutes. The laminates were then cooled in the press at the same pressure until the temperature of the laminate was lower than 70°C. This process resulted in a laminates with an average porosity of between 18% and 30%. (See Table 4).

3D ceramic moulded parts were then made from the cooled laminates in the way described in Comparative Experiment A. The linear pressure on the projected plan was 9 MPa in all cases. Table 2a shows the values of the camber. Table 2a shows that in the case of the dish used in this example a dish without delaminations and step formation having an average camber of 63% is obtained at a laminating pressure of 8 MPa. This shows that the degree to which the form is retained during the sintering is much poorer when use is made of a rigid mould and a linear pressure than when a pressure from all sides and a Quasi Isostatic mould are used.

TABLE 1

Processing data on laminating pressure & forming pressure:

| Nos. | Laminating pressure [MPa] | Forming pressure [MPa] | Type of mould |
|---|---|---|---|
| 1–9 | 1.5 | 9 | QI mould |
| 10 & 11 | 1.5 | 10 | QI mould |
| 12 & 13 | 1.5 | 13 | QI mould |
| 14–18 | 1.5 | 9 | rigid mould |
| 19–23 | 1.5 | 18 | rigid mould |
| 24 & 25 | 1 | 9 | QI mould |
| 26–31 | 2 | 9 | QI mould |
| 32–34 | 3 | 9 | QI mould |
| 35 | 3.7 | 9 | QI mould |
| 36 | 0.5 | 9 | QI mould |
| 37 | 8 | 9 | QI mould |
| 38 | 2 | 9 | rigid mould |
| 39 & 40 | 8 | 9 | rigid mould |

TABLE 2

QI mould: Laminating pressure vs camber measurements

| No. | laminating pressure [MPa] | Camber [‰] | Average Camber [‰] | St. dev. | Step formation/adhesion |
|---|---|---|---|---|---|
| 36 | 0.5 | −15.2 | | | layers shifted from one another poor adhesion |
| 24 | 1 | −1.1 | 0.5 | 2.3 | a lot of step formation |
| 25 | 1 | 2.2 | | | poor adhesion |
| 1 | 1.5 | 1.9 | 3.8 | 2.6 | good adhesion |
| 2 | 1.5 | 6.0 | | | no step formation |
| 3 | 1.5 | 2.8 | | | |
| 4 | 1.5 | 5.4 | | | |
| 5 | 1.5 | 6.2 | | | |
| 6 | 1.5 | 4.5 | | | |
| 7 | 1.5 | 5.4 | | | |
| 8 | 1.5 | −2.1 | | | |
| 9 | 1.5 | | | | |
| 26 | 2 | 7.2 | 10.2 | 2.5 | good adhesion |
| 27 | 2 | 10.3 | | | little step formation |
| 28 | 2 | 8.3 | | | |
| 29 | 2 | 9.5 | | | |
| 30 | 2 | 11.6 | | | |
| 31 | 2 | 14.2 | | | |
| 32 | 3 | 11.4 | 13.3 | 2.2 | good adhesion |
| 33 | 3 | 15.7 | | | no step formation |
| 34 | 3 | 12.8 | | | |
| 35 | 3.7 | 13.5 | 13.5 | | no step formation good adhesion |
| 37 | 8 | 27.3 | | | no step formation good adhesion |

TABLE 2a

Rigid mould: Laminating pressure vs camber measurements

| No. | laminating pressure [MPa] | Camber*) [‰] | Average [‰] | St. dev. | Step formation/adhesion |
|---|---|---|---|---|---|
| 38 | 2 | 41.7 | | | good adhesion in the base plane; almost no step formation |
| 39 | 8 | 61.9 | 62.6 | 0.9 | good adhesion in the base plane; no step formation |
| 40 | 8 | 63.2 | | | |

*)Camber = difference in height between rim and middle/15 mm*1000

TABLE 3

QI mould shrinkage date

| No. | thickness of base (centre) [%] | thickness of base (edge) [%] | wall thickness [%] | Diameter [%] | Height (middle) [%] | Height (edge) [%] |
|---|---|---|---|---|---|---|
| 1–9 | 21.1 | 21.2 | 19.1 | 18.9 | 21.5 | 20.7 |
| 10 & 11 | 25.5 | 25.4 | 18.9 | 18.7 | 28.2 | 25.5 |
| 12 & 13 | 25.5 | 27.0 | 13.8 | 18.3 | 26.6 | 27.4 |

TABLE 3a

Rigid mould shrinkage date

| No. | thickness of base (centre) [%] | thickness of base (edge) [%] | wall thickness [%] | Diameter [%] | Height (middle) [%] | Height (edge) [%] |
|---|---|---|---|---|---|---|
| 14–18 | 21.1 | 21.3 | 6.2 | 19.3 | 21.7 | |
| 19–23 | 19.6 | 20.1 | 15.7 | 19.1 | 13.8 | |

TABLE 3b

"Green" moulded parts

| No. | Laminating pressure [MPa] | forming pressure [MPa] | Thickness of base centre [mm] | St. Dev. [mm] | Thickness of base edge [mm] | St. Dev. [mm] | Wall thickness [mm] | St. Dev. [mm] | Diameter [mm] | St. Dev. [mm] | Height [mm] | Weight [gram] |
|---|---|---|---|---|---|---|---|---|---|---|---|---|
| 1 | 1.5 | 9 | 2.26 | | 2.27 | 0.01 | 2.03 | 0.01 | 49.99 | 0.03 | 7.17 | 11.493 |
| 2 | 1.5 | 9 | 2.24 | | 2.24 | 0.02 | 2.00 | 0.05 | 49.95 | 0.01 | 7.17 | 11.407 |
| 3 | 1.5 | 9 | 2.18 | | 2.17 | 0.01 | 1.94 | 0.03 | 49.88 | 0.02 | 7.28 | 11.122 |
| 4 | 1.5 | 9 | 2.15 | | 2.19 | 0.02 | 1.93 | 0.05 | 49.91 | 0.02 | 7.13 | 10.865 |
| 5 | 1.5 | 9 | 2.20 | | 2.22 | 0.01 | 1.95 | 0.05 | 49.95 | 0.01 | 7.16 | 11.146 |
| 6 | 1.5 | 9 | 2.19 | | 2.21 | 0.02 | 1.96 | 0.04 | 49.92 | 0.01 | 7.22 | 11.240 |
| 7 | 1.5 | 9 | 2.25 | | 2.25 | 0.01 | 1.95 | 0.08 | 49.95 | 0.01 | 7.15 | 11.376 |
| 8 | 1.5 | 9 | 2.25 | | 2.25 | 0.02 | 1.94 | 0.06 | 49.93 | 0.05 | 7.15 | 11.319 |
| 9 | 1.5 | 9 | 2.22 | | 2.23 | 0.01 | 1.96 | 0.07 | 49.90 | 0.03 | 7.20 | 11.167 |
| 10 | 1.5 | 10 | 2.36 | | 2.38 | 0.01 | 1.89 | 0.13 | 49.73 | 0.04 | 7.50 | 11.121 |
| 11 | 1.5 | 10 | 2.35 | | 2.36 | 0.01 | 1.84 | 0.05 | 49.67 | 0.01 | 7.45 | 11.135 |
| 12 | 1.5 | 13 | 2.30 | | 2.33 | 0.01 | 1.80 | 0.09 | 49.67 | 0.01 | 7.41 | 11.020 |
| 13 | 1.5 | 13 | 2.33 | | 2.34 | 0.00 | 1.80 | 0.14 | 49.71 | 0.01 | 7.28 | 11.138 |
| 14 | 1.5 | 9 | 2.52 | 0.00 | 2.49 | 0.01 | 2.58 | 0.01 | 49.70 | 0.01 | 9.94 | 14.26 |
| 15 | 1.5 | 9 | 2.63 | 0.00 | 2.60 | 0.01 | 2.50 | 0.02 | 49.66 | 0.13 | 10.03 | 14.11 |
| 16 | 1.5 | 9 | 2.65 | 0.01 | 2.61 | 0.01 | 2.70 | 0.03 | 49.85 | 0.01 | 9.71 | 15.02 |
| 17 | 1.5 | 9 | 2.75 | 0.00 | 2.72 | 0.01 | 2.61 | 0.05 | 49.83 | 0.07 | 9.96 | 14.42 |
| 18 | 1.5 | 9 | 2.73 | 0.01 | 2.70 | 0.01 | 2.69 | 0.02 | 49.96 | 0.03 | 9.91 | 14.51 |
| 19 | 1.5 | 18 | 2.45 | 0.01 | 2.41 | 0.01 | 2.55 | 0.02 | 49.68 | 0.05 | 9.76 | 14.37 |
| 20 | 1.5 | 18 | 2.58 | 0.01 | 2.54 | 0.01 | 2.56 | 0.05 | 49.80 | 0.04 | 9.75 | 14.64 |
| 21 | 1.5 | 18 | 2.46 | 0.01 | 2.42 | 0.01 | 2.61 | 0.02 | 49.83 | 0.04 | 9.81 | 14.15 |
| 22 | 1.5 | 18 | 2.45 | 0.01 | 2.41 | 0.01 | 2.62 | 0.02 | 49.92 | 0.03 | 9.76 | 13.94 |
| 23 | 1.5 | 18 | 2.61 | 0.00 | 2.58 | 0.02 | 2.64 | 0.04 | 49.95 | 0.02 | 9.86 | 14.92 |

TABLE 3c

Sintered moulded parts

| No. | Laminating pressure [MPa] | forming pressure [MPa] | Thickness of base center [mm] | St. Dev. [mm] | Thickness of base edge [mm] | St. Dev. [mm] | Wall thickness [mm] | St. Dev. [mm] | Diameter [mm] | St. Dev. [mm] | Height [mm] | Weight [gram] |
|---|---|---|---|---|---|---|---|---|---|---|---|---|
| 1 | 1.5 | 9 | 1.74 | | 1.76 | 0.01 | 1.61 | 0.07 | 40.52 | 0.11 | 5.37 | 9.367 |
| 2 | 1.5 | 9 | 1.78 | | 1.79 | 0.00 | 1.56 | 0.06 | 40.61 | 0.08 | 5.54 | 9.499 |
| 3 | 1.5 | 9 | 1.78 | | 1.77 | 0.01 | 1.58 | 0.07 | 40.57 | 0.13 | 5.56 | 9.602 |
| 4 | 1.5 | 9 | 1.73 | | 1.73 | 0.01 | 1.57 | 0.02 | 40.53 | 0.06 | 5.59 | 9.517 |
| 5 | 1.5 | 9 | 1.74 | | 1.76 | 0.01 | 1.61 | 0.04 | 40.42 | 0.11 | 5.55 | 9.423 |
| 6 | 1.5 | 9 | 1.69 | | 1.71 | 0.00 | 1.58 | 0.04 | 40.32 | 0.07 | 5.51 | 9.189 |
| 7 | 1.5 | 9 | 1.71 | | 1.71 | 0.01 | 1.57 | 0.03 | 40.46 | 0.05 | 5.60 | 9.409 |
| 8 | 1.5 | 9 | 1.77 | | 1.78 | 0.01 | 1.60 | 0.05 | 40.63 | 0.14 | 5.61 | 9.644 |
| 9 | 1.5 | 9 | 1.78 | | 1.78 | 0.01 | 1.60 | 0.01 | 40.39 | 0.06 | 5.43 | 9.693 |
| 10 | 1.5 | 10 | 1.76 | | 1.77 | 0.01 | 1.52 | 0.08 | 40.38 | 0.12 | 5.24 | 9.175 |
| 11 | 1.5 | 10 | 1.75 | | 1.77 | 0.01 | 1.51 | 0.05 | 40.47 | 0.11 | 5.31 | 9.134 |
| 12 | 1.5 | 13 | 1.73 | | 1.73 | 0.01 | 1.51 | 0.04 | 40.60 | 0.07 | 5.25 | 9.161 |

TABLE 3c-continued

Sintered moulded parts

| No. | Laminating pressure [MPa] | forming pressure [MPa] | Thickness of base center [mm] | St. Dev. [mm] | Thickness of base edge [mm] | St. Dev. [mm] | Wall thickness [mm] | St. Dev. [mm] | Diameter [mm] | St. Dev. [mm] | Height [mm] | Weight [gram] |
|---|---|---|---|---|---|---|---|---|---|---|---|---|
| 13 | 1.5 | 13 | 1.72 |      | 1.68 | 0.01 | 1.60 | 0.05 | 40.65 | 0.10 | 5.39 | 9.012 |
| 14 | 1.5 | 9  | 2.01 | 0.00 | 1.98 | 0.01 | 2.47 | 0.03 | 40.75 | 0.16 | 7.42 | 12.15 |
| 15 | 1.5 | 9  | 2.07 | 0.01 | 2.05 | 0.02 | 2.43 | 0.05 | 40.15 | 0.25 | 7.97 | 12.02 |
| 16 | 1.5 | 9  | 2.12 | 0.01 | 2.09 | 0.01 | 2.52 | 0.05 | 40.88 | 0.07 | 7.49 | 12.80 |
| 17 | 1.5 | 9  | 2.17 | 0.00 | 2.13 | 0.02 | 2.44 | 0.03 | 40.13 | 0.11 | 7.69 | 12.29 |
| 18 | 1.5 | 9  | 2.16 | 0.00 | 2.12 | 0.01 | 2.43 | 0.06 | 40.40 | 0.05 | 7.75 | 12.37 |
| 19 | 1.5 | 18 | 1.97 | 0.01 | 1.95 | 0.01 | 2.39 | 0.09 | 40.79 | 0.26 | 8.66 | 12.24 |
| 20 | 1.5 | 18 | 2.07 | 0.01 | 2.07 | 0.01 | 2.32 | 0.04 | 40.75 | 0.20 | 8.28 | 12.48 |
| 21 | 1.5 | 18 | 1.97 | 0.01 | 1.94 | 0.02 | 2.23 | 0.04 | 40.36 | 0.13 | 8.45 | 12.06 |
| 22 | 1.5 | 18 | 1.97 | 0.01 | 1.93 | 0.01 | 2.18 | 0.03 | 40.10 | 0.10 | 8.44 | 11.88 |
| 23 | 1.5 | 18 | 2.10 | 0.00 | 2.05 | 0.01 | 2.22 | 0.03 | 40.70 | 0.07 | 8.47 | 12.72 |

TABLE 4

| laminating pressure | mass [g] | length [mm] | width [mm] | thickness [mm] | porosity [%] | average porosity [%] |
|---|---|---|---|---|---|---|
| 0.5 | 0.6701 | 33.24 | 5.078 | 2.025 | 28.3 | 28.9 |
|     | 0.5468 | 44.29 | 5.081 | 1.243 | 28.6 |      |
|     | 0.9692 | 42.28 | 5.05  | 2.36  | 29.7 |      |
| 1   | 1.0681 | 40.62 | 5.088 | 2.518 | 25.0 | 25.6 |
|     | 0.7615 | 29.34 | 5.037 | 2.551 | 26.2 |      |
| 1.5 | 6.2779 | 44.09 | 28.13 | 2.46  | 24.8 | 25.0 |
|     | 3.6896 | 44.07 | 16.61 | 2.46  | 25.1 |      |
| 2   | 0.7703 | 34.38 | 4.94  | 2.176 | 23.8 | 24.5 |
|     | 0.7075 | 43.18 | 4.995 | 1.563 | 23.3 |      |
|     | 1.2066 | 53.13 | 5.021 | 2.244 | 26.3 |      |
| 5   | 0.9127 | 35.56 | 5.022 | 2.302 | 18.9 | 18.3 |
|     | 1.1616 | 44.88 | 5.03  | 2.285 | 17.7 |      |

What is claimed is:

1. A process for production of a multilayer ceramic moulded article comprising:
   a) creating at least one self-supporting ceramic film comprising,
      i) a binder containing at least one polyolefin having an intrinsic viscosity of at least 5 dl/g as determined at 135° C. in decalin, and
      ii) inorganic solids in an amount of between 40 and 80% relative to total volume of the inorganic solids and binder, wherein said film has a porosity of between 30 and 90%;
   b) forming at least one electrically conductive path on said at least one ceramic film to form at least one electrically conductive first film;
   c) forming a composite from,
      i) said at least one electrically conductive first film formed in b), and
      ii) at least one second film comprising the ceramic film according to a) or said at least one electrically conductive film according to b), wherein a surface of the first film with the at least one electrically conductive path lies against to the at least one second film,
   d) subjecting the composite formed in c) to elevated temperature and pressure to form a laminate having a porosity between 10 and 40%, e) deforming said laminate formed in d) under pressure from all sides into a dish shape green moulding comprising at least one curved section, and f) burning out and sintering said green moulding to form the multilayer ceramic moulded article.

2. The process according to claim 1, wherein said at least one ceramic film has a surface roughness, expressed in a $R_a$ value, of less than 1 μm.

3. The process according to claim 2, wherein said at least one ceramic film has a surface roughness, expressed in the $R_a$ value, of less than 0.5 μm.

4. The process according to claim 1, wherein said at least one ceramic film has an elongation at break of more than 75%.

5. The process according to claim 4, wherein said at least one ceramic film has an elongation at break of more than 300%.

6. The process according to claim 1, wherein said at least one ceramic film has a modulus of more than 500 MPa.

7. The process according to claim 1, wherein said at least one ceramic film has a modulus of more than 1 GPa.

8. The process according to claim 1, wherein said at least one ceramic film is further provided with vias.

9. The process according to claim 1, wherein the step d) is conducted at the temperature of between 100 and 160° C., and the pressure of between 0.5 and 10 MPa.

10. The process according to claim 1, wherein the step e) is conducted at the temperature between 100 and 160° C.

11. The process according to claim 1, wherein said formed article shrinks to substantially a same extent in all directions.

12. The process according to claim 1, wherein said at least one electrically conductive path is present in said at least one curved section.

13. The process according to claim 1, wherein the step e) further comprising the at least one curved section curved at an angle of 40° to 180° and having a radius of curvature of from 1 mm to 100 mm.

14. The process according to claim 1, wherein the step e) the at least one curved section comprises two curved sections curved perpendicular to one another.

* * * * *